United States Patent
Bu et al.

(10) Patent No.: US 10,937,867 B2
(45) Date of Patent: Mar. 2, 2021

(54) CONFORMAL DOPING FOR PUNCH THROUGH STOPPER IN FIN FIELD EFFECT TRANSISTOR DEVICES

(71) Applicant: INTERNATIONAL BUSINESS MACHINES CORPORATION, Armonk, NY (US)

(72) Inventors: Huiming Bu, Millwood, NY (US); Sivananda K. Kanakasabapathy, Niskayuna, NY (US); Fee Li Lie, Albany, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/515,789

(22) Filed: Jul. 18, 2019

(65) Prior Publication Data
US 2019/0341457 A1 Nov. 7, 2019

Related U.S. Application Data

(60) Division of application No. 15/358,661, filed on Nov. 22, 2016, now Pat. No. 10,453,922, which is a
(Continued)

(51) Int. Cl.
*H01L 29/76* (2006.01)
*H01L 29/10* (2006.01)
(Continued)

(52) U.S. Cl.
CPC ........ *H01L 29/1083* (2013.01); *H01L 21/223* (2013.01); *H01L 21/324* (2013.01); *H01L 29/0638* (2013.01); *H01L 29/0649* (2013.01); *H01L 29/6653* (2013.01); *H01L 29/6656* (2013.01); *H01L 29/66803* (2013.01)

(58) Field of Classification Search
None
See application file for complete search history.

(56) References Cited

U.S. PATENT DOCUMENTS

| | | |
|---|---|---|
| 8,404,550 B2 | 3/2013 | Scheiper et al. |
| 8,932,918 B2 | 1/2015 | Cheng et al. |
| (Continued) | | |

OTHER PUBLICATIONS

List of IBM Patents or Patent Applications Treated as Related dated Jul. 22, 2019, 2 pages.
(Continued)

*Primary Examiner* — Hung K Vu
(74) *Attorney, Agent, or Firm* — Tutunjian & Bitetto. P.C.; Douglas Pearson

(57) ABSTRACT

A method of forming a punch through stop region that includes forming isolation regions of a first dielectric material between adjacent fin structures and forming a spacer of a second dielectric material on sidewalls of the fin structure. The first dielectric material of the isolation region may be recessed with an etch process that is selective to the second dielectric material to expose a base sidewall portion of the fin structures. Gas phase doping may introduce a first conductivity type dopant to the base sidewall portion of the fin structure forming a punch through stop region underlying a channel region of the fin structures.

20 Claims, 7 Drawing Sheets

Related U.S. Application Data continuation of application No. 14/922,939, filed on Oct. 26, 2015, now Pat. No. 9,583,563.

(51) Int. Cl.
  *H01L 29/06* (2006.01)
  *H01L 29/66* (2006.01)
  *H01L 21/223* (2006.01)
  *H01L 21/324* (2006.01)

(56) References Cited

U.S. PATENT DOCUMENTS

| | | | |
|---|---|---|---|
| 2013/0105914 A1* | 5/2013 | Lin | H01L 29/66795 257/402 |
| 2013/0280883 A1 | 10/2013 | Faul et al. | |
| 2014/0061794 A1 | 3/2014 | Cheng et al. | |
| 2014/0117462 A1 | 5/2014 | Cheng et al. | |
| 2014/0306274 A1 | 10/2014 | Basker et al. | |
| 2014/0315371 A1 | 10/2014 | Cai et al. | |
| 2015/0054033 A1 | 2/2015 | Cheng et al. | |
| 2015/0279963 A1* | 10/2015 | Xie | H01L 27/0886 257/410 |
| 2015/0303284 A1* | 10/2015 | Basker | H01L 29/66803 257/288 |
| 2017/0117365 A1 | 4/2017 | Bu et al. | |

OTHER PUBLICATIONS

Office Action with cited art in corresponding U.S. Appl. No. 16/515,853 dated Oct. 4, 2019.

\* cited by examiner

CONFORMAL DOPING FOR PUNCH THROUGH STOPPER IN FIN FIELD EFFECT TRANSISTOR DEVICES

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming a punch through stop (PTS) region in a fin structure is provided that includes localizing punch through stop doping to minimize dopant diffusion into the channel region of the device. In one embodiment, the method includes forming a spacer of a dielectric material on sidewalls of fin structures, wherein adjacent fin structures are separated by a dielectric isolation region. The dielectric isolation regions are recessed to expose a portion of the fin structures underlying the spacer of the dielectric material. The exposed portion of the fin structures underlying the spacer are doped with a dopant having a first conductivity type. The spacer of the dielectric material is removed. Source and drain regions are formed on the source and drain region portions of the fin structure, the source and drain regions doped with a second conductivity type dopant.

In another embodiment, the method of forming a punch through stop region in a fin structure may include forming isolation regions of a first dielectric material between adjacent fin structures. A spacer of a second dielectric material is formed on sidewall of the fin structure. An etch process that is selective to the second dielectric material recesses the first dielectric material of the isolation region so expose a base sidewall portion of the fin structures. Gas phase doping introduces a first conductivity type dopant to the base sidewall portion of the fin structure forming a punch through stop region underlying a channel region of the fin structures.

In another aspect of the present disclosure, a semiconductor device is provided that includes a punch through stop region of a first conductivity type dopant that is present in a base portion of a fin structure that is underlying a channel portion of the semiconductor device. Source and drain regions of a second conductivity type are present on the source and drain region portions of the fin structure. The channel portion of the semiconductor device is substantially free of the first conductivity type dopant that provides the punch through stop region.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
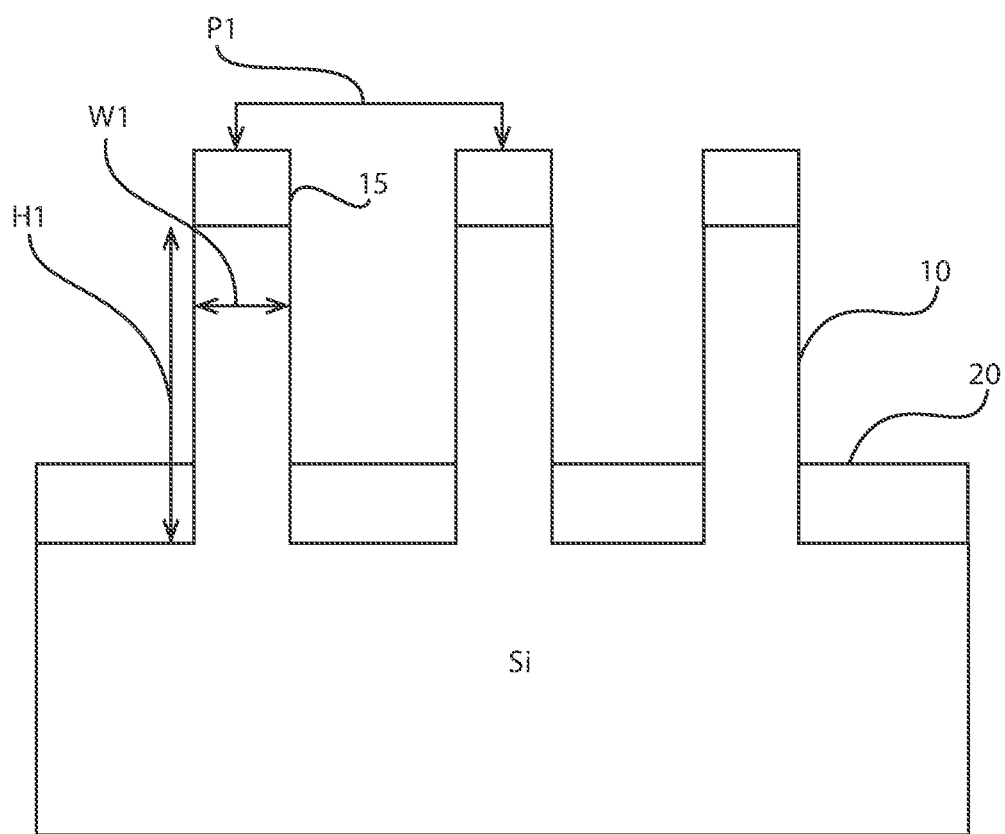
FIG. 1 is a side cross-sectional view that depicts forming at least one fin structure from a bulk semiconductor substrate, in which isolation regions of a first dielectric material is present between adjacent fin structures, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure.

In some embodiments, the methods and structures disclosed herein provide a punch through stopper (PTS) region for reducing the incidence of leakage based performance degradation in FinFETs. It has been determined that the formation of punch through stopper (PTS) regions formed in FinFETs using prior methods have a number of disadvantages. For example, forming a punch through stopper (PTS) region in a fin structure by ion implantation produces a high concentration of the dopant for the punch through stopper (PTS) region in the at least the channel region of the FinFET. This results in a low mobility of charge carriers in the device, as well as a large variation in threshold voltage (Vt). Further, introducing punch through stopper (PTS) dopant into the channel region of a fin structure, using any method including diffusion from dopant layers, results in the same effect as implanting the dopant into the channel region. The present disclosure provides a means to introduce punch through stopper dopant to the portion of the fin structure underlying the channel region without introducing high concentrations of the punch through stopper (PTS) region dopant into the active region of the fin structure, i.e., the channel region and the source and drain region.

More specifically, in some embodiments, the present disclosure uses a spacer formed on the sidewalls of fin structure to function as a mask, protecting the active portion of the fin structures, i.e., channel region, source region and drain region, leaving a base portion of the fin structure exposed to be implanted with the punch through stop dopant by gas phase doping. In some embodiments, by masking the active portion of the fin structure and using gas phase doping to introduce the punch through stop dopant into a base portion of the fin structures, the present disclosure provides a punch through stopper (PTS) region without introducing a high concentration of punch through stopper (PTS) dopant to the active portion of the fin structure. The methods and structures of the present disclosure are now discussed with more detail referring to FIGS. 1-7.

FIG. 1 depicts one embodiment of forming at least one fin structure 10 from a semiconductor substrate. The at least one fin structure 10 may be formed from a bulk semiconductor substrate 5. The at least one fin structure 10 may be formed using photolithography and etch processes. In one embodiment, a hard mask 15 is formed on the bulk semiconductor substrate 1 prior to etch processing for forming the at least one fin structure 10. For example, a hard mask dielectric layer, such as a nitride or oxide material layer, may be blanket deposited atop the bulk semiconductor substrate 5 prior to etching to form the at least one fin structure 10. For example, the hard mask dielectric layer may be blanket deposited using a deposition process, such as chemical vapor deposition (CVD), e.g., plasma enhanced chemical vapor deposition (PECVD), chemical solution deposition, spin on deposition or physical vapor deposition. The hard mask dielectric layer may have a thickness ranging from 2 nm to 15 nm. In some examples, in which the later described fin spacer is composed of a nitride and the isolation regions between adjacent fin structures 10 is composed of an oxide, the blanket deposited hard mask dielectric layer may be composed of a nitride, e.g., $Si_3N_4$, or silicon oxynitride.

An etch mask, e.g., photoresist mask, may then be formed on the blanket deposited hard mask dielectric layer. To provide the photoresist mask, a photoresist layer is first positioned on the layer of the dielectric material that provides dielectric fin cap. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

The blanket deposited hard mask layer than may be etched using an etch process that is selective to at least the photoresist mask, wherein the portion of the blanket deposited hard mask layer protected by the photoresist mask remain to provide the hard mask 15 and the exposed portions of the blanket deposited hard mask layer are removed. The photoresist mask may then be removed.

The bulk semiconductor substrate 1 may then be etched using the hard mask 15 as an etch mask to form the fin structures 10. The etch process for forming the at least one fin structure 10 may be an anisotropic etch. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiments, the etch process for etching the bulk semiconductor substrate 1 and defining the at least one fin structure 10 is a timed etch. It is noted that the above description of the etch sequence for forming the fin structures is only one example, and the present disclosure is not intended to be limited to only this example. For example, the etch process for forming the at least one fin structure 10 may be included within a sidewall image transfer (SIT) process flow in which a mandrel structure is used to form a spacer, in which following formation of the spacer, the mandrel is removed and the spacer can function as an etch mask. Still referring to FIG. 1, the etch process may continue until each of the fin structures 10 may have a height $H_1$ ranging from 5 nm to 200 nm. In another embodiment, each of the fin structures 10 has a height $H_1$ ranging from 10 nm to 100 nm. In one example, each of the fin structures 10 has a height $H_1$ ranging from 20 nm to 50 nm. Each of the fin structures 10 may have a width $W_1$ of less than 15 nm. In another embodiment, each of the fin structures 10 has a width $W_1$ ranging from 3 nm to 8 nm. Although one fin structure 10 is depicted in FIG. 1, the present disclosure is not limited to only this example. It is noted that any number of fin structures 10 may be employed in accordance with the present disclosure. In some embodiments, the pitch P1, i.e., center to center, distance separating adjacent fin structures 10 may range 35 nm to 45 nm. In another example, the pitch P1 separating adjacent fin structures 10 may range from 30 nm to 40 nm.

In some embodiments, the at least one fin structure 10 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. A compound semiconductor may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the fin structures 10 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. It is noted that in some embodiments, the fin structures 10 are formed from the substrate 1. Therefore, in some embodiments, the fin structure 10 and the supporting substrate 1 have the same composition.

In one example, the bulk substrate 5 is composed of silicon (Si) and the fin structures 10 may be composed of silicon germanium (SiGe). In this example, the silicon germanium (SiGe) fin structures 10 can be formed from silicon (Si) fin structures that are formed using subtractive methods, such as etching, from the substrate 5 using condensation and thermal mixing methods. In another example, both the bulk substrate 5 and the fin structures 10 are composed of the same material. For example, both the bulk substrate 5 and the fin structures can be composed of silicon (Si).

FIG. 1 also depicts isolation regions 20 present between adjacent fin structures 10. The isolation region 20 may be composed of a first dielectric material that can be etched selectively to at least the second dielectric material of the later described spacer that is formed on the fin structure sidewalls. As will be described below, the spacer of the second dielectric material that is formed on the sidewalls of the active region of the fin structures functions as a mask during punch stop through doping of the base portion of the fin structures 10. In some examples, the isolation region 20 may be composed of an oxide or oxynitride material. In one example, when the isolation region 20 is composed of an oxide, the oxide may be silicon oxide. The dielectric material of the isolation region 20 may be formed using a CVD or other like deposition process. The dielectric of the isolation region 20 may be densified after deposition. For example, the isolation region 20 may be annealed. In some embodiment, an etch process may be employed to control the height of the isolation region 20.

Figure 2:
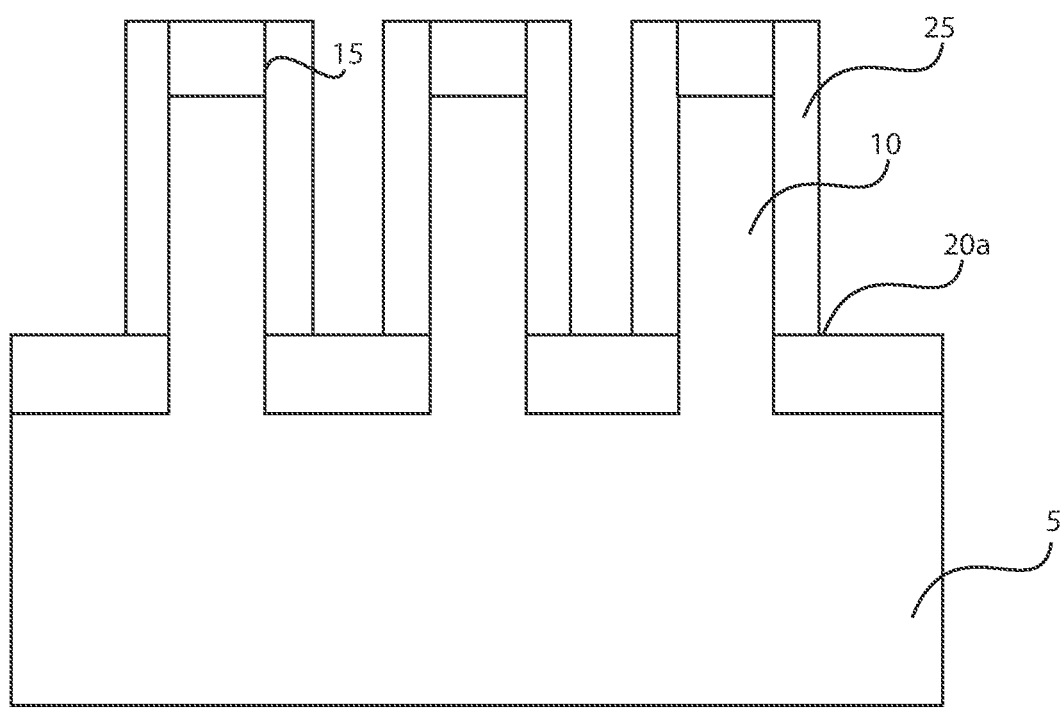
FIG. 2 is a side cross-sectional view depicting forming a spacer of a second dielectric material on sidewalls of the fin structures depicted in FIG. 1, in accordance with one embodiment of the present disclosure.

FIG. 2 depicts forming a spacer 25 of a second dielectric material on sidewalls of the fin structures 10 depicted in FIG. 1. The material of the spacer 25 is selected so that the first dielectric material of the isolation region 20 may be etched selectively to the spacer. The term "selective" as used to describe a material removal process denotes that the rate of material removal for a first material is greater than the rate of removal for at least another material of the structure to which the material removal process is being applied. In some embodiments, in which the isolation regions 20 are an oxide, such as silicon oxide, the spacer 25 may be a nitride, such as silicon nitride or a silicon oxynitride. It is noted that the above compositions are only one example of dielectric compositions that can be suitable for forming the isolation region 20 and the spacer 25, and it is not intended that the present disclosure be limited to only those examples. Any material that is suitable for selective etching relative to at least one of the first dielectric of the isolation region 20 is suitable for use with the spacer 25 of with the present disclosure.

In some embodiments, the spacer 25 is formed using a conformal deposition method in combination with an etch back process, such as an anisotropic etch. The term "conformal" or "conformal deposition" denotes a layer or a deposition process that produces a layer having a thickness that does not deviate from greater than or less than 30% of an average value for the thickness of the layer. The dielectric layer for the spacer 25 may be blanket deposited over the entirety of the structure depicted in FIG. 1. The dielectric layer may be deposited using chemical vapor deposition (CVD), such as plasma enhanced CVD (PECVD) or metal organic chemical vapor deposition (MOCVD). The dielectric layer for the spacer 25 may also be formed using chemical solution deposition or physical vapor deposition. The dielectric layer for the spacer 25 may have a thickness ranging from 2 nm to 50 nm. In other embodiments, the thickness of the dielectric layer for the spacer 25 ranges from 5 nm to 25 nm.

Following deposition of the blanket conformal dielectric layer, an etch process may be applied to the dielectric layer to remove the portions of the dielectric layer that is present on the upper surfaces of the isolation regions 20 that are separating the adjacent fin structures 10. The etch process may also remove the portion of the dielectric layer for the spacer 25 that is present atop the hard mask 15. Referring to FIG. 2, a remaining portion of the dielectric layer that provides the spacers 25 may be present on the sidewalls of the fin structure 10. The sidewall portion of the fin structures 10 that the dielectric layer for the spacer 25 is present on includes the active portion of the fin structure 10, which includes the channel region, the source region and the drain region portions of the fin structure 10. These are the portions of the fin structure 10 in which the charge carriers are traveling during functioning of the FinFET. The isolation portion of the fin structure 10 is present between the active portion of the fin structure and the supporting substrate 5. The isolation portion of the fin structure 10 is further processed to provide the location of the punch through stopper (PTS) region of the FinFET, which obstructs the charge carriers from leaking out of the active portion of the fin structure 10.

In some embodiments, the portions of the dielectric layer that provides the spacer 25 that are removed by the etch process include the horizontal portions of the dielectric layer, wherein the vertical portions of the dielectric layer remain on the sidewalls of the fin structure including the active portion of the fin structure 10. The horizontal portions of the dielectric layer that are removed may be removed by an anisotropic etch. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation.

The etch process for removing the horizontal portions of the dielectric layer of the spacer 25 may be a selective etch process. For example, in one embodiment, a selective etch may include an etch chemistry that removes a second material of the dielectric layer for the spacer 25 selectively to a first dielectric material of the isolation region 20 by a ratio of 100:1 or greater.

Figure 3:
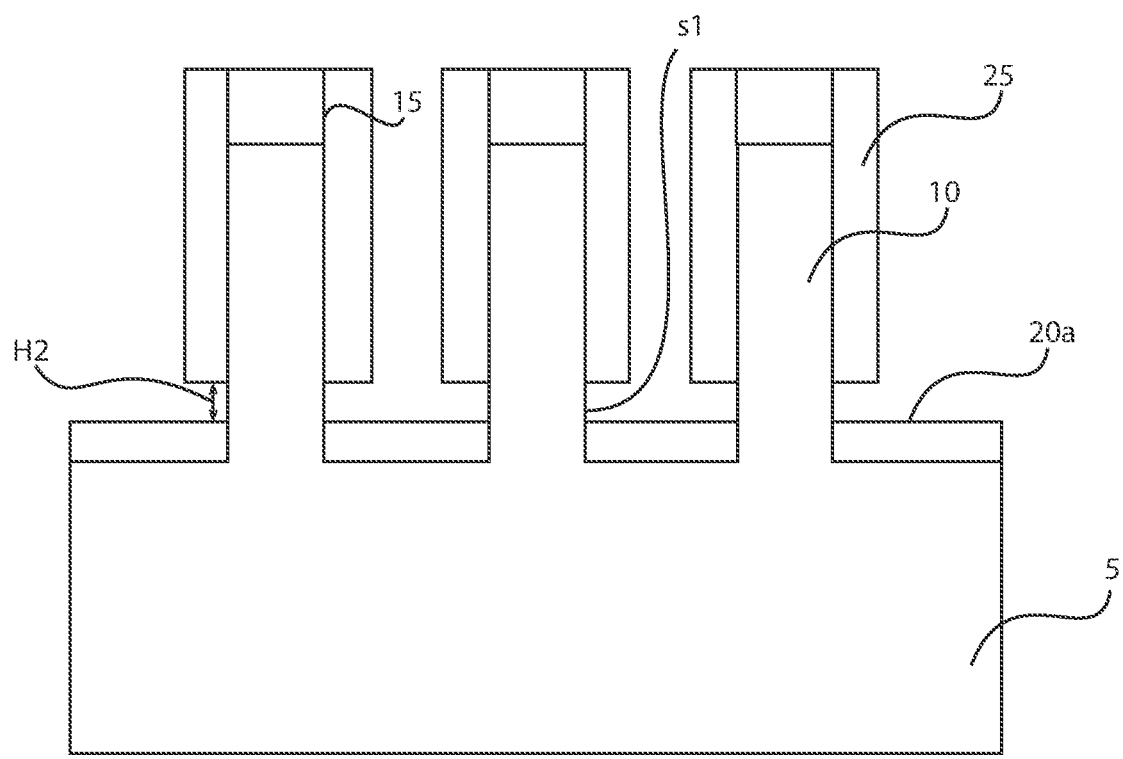
FIG. 3 is a side cross-sectional view depicting recessing the first dielectric material of the isolation regions selectively to the second dielectric material of the spacer to expose a sidewall of the base portion of the fin structures, in accordance with one embodiment of the present disclosure.

FIG. 3 depicts one embodiment of recessing the first dielectric material of the isolation regions 20a selectively to the second dielectric material of the spacer 25 to expose a sidewall S1 of the base portion of the fin structures 10. The etch process for recessing the first dielectric material may also be selective to the hard mask 15 that is present on the upper surface of the fin structures 10. The active region of the fin structures 10 are enclosed in the spacers 25 of the second dielectric material, as well as the hard mask 15, which may also be composed of the second dielectric material. As noted above, in some embodiments, the second dielectric material may be a nitride.

The etch process for exposing the sidewall S1 of the lower portion of the fin structure 10 may include at least one undercut type etch to remove the portion of the isolation region 20 that is directly abutting the sidewall of the fin structure, and is underlying the spacer 25 of the second dielectric material. To provide the undercut characteristics, the etch process may be isotropic. The term "isotropic etch" denotes an etch process that is non-directional. By "non-directional" it is meant that the etch rate is not substantially greater in any one direction in comparison to all of the etch directions. The isotropic etch may be a wet chemical etch or a dry etch. For example, the etchant may be a corrosive liquid or a chemically active ionized gas, such as a plasma, e.g., plasma etch. The etch process for exposing the sidewall S1 of the lower portion of the fin structure 10 may also employ an anisotropic etch, such as reactive ion etch, in combination with an isotropic etch.

In some embodiments, the first dielectric material of the isolation region 20a may be recessed to provide a sidewall S1 on the lower portion of the fin structure, i.e., between the active portion of the fin structure 10 and the base substrate 5, that has a height H2 ranging from 10 nm to 20 nm. In other embodiments, the first dielectric material of the isolation region 20a may be recessed to provide a sidewall S1 on the lower portion of the fin structure, i.e., between the active portion of the fin structure 10 and the base substrate 5, that has a height H2 ranging from 10 nm to 20 nm.

Figure 4:
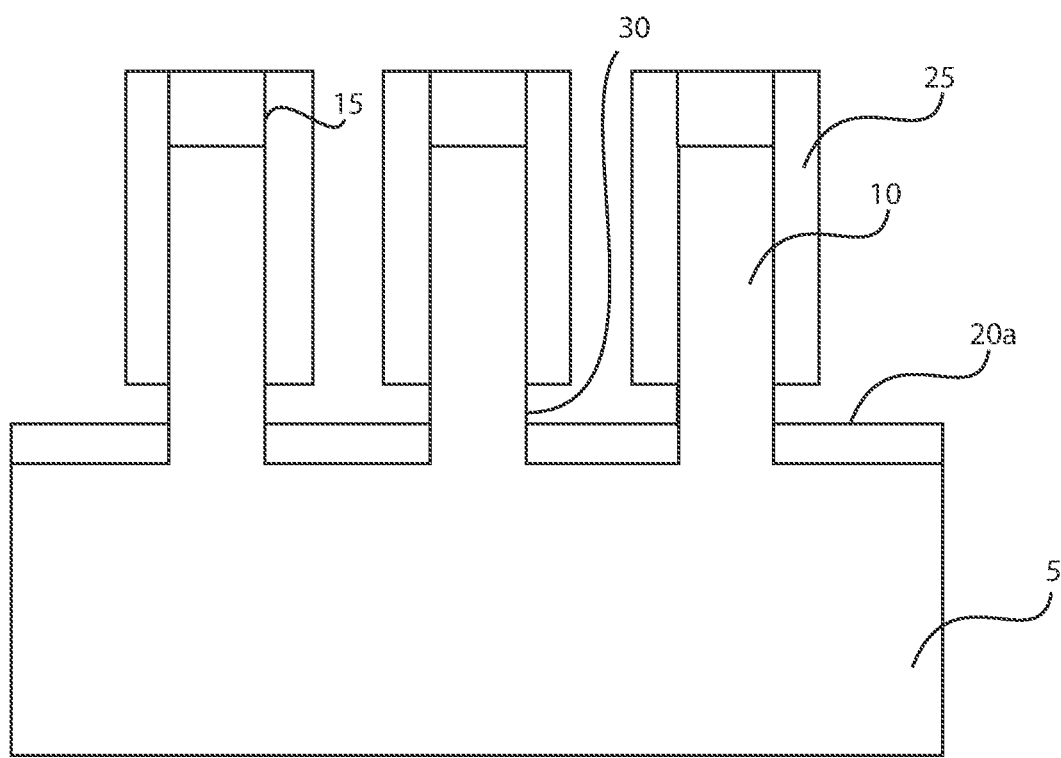
FIG. 4 is a side cross-sectional view depicting introducing a first conductivity type dopant to the base sidewall portion of the fin structure forming a punch through stop region underlying a channel region of the fin structures, in accordance with one embodiment of the present disclosure.

FIG. 4 depicts introducing a first conductivity type dopant to the base sidewall S1 portion of the fin structure 10 to form a punch through stop region 30 underlying at least a channel region of the fin structures 10. In some embodiments, the punch through stop 30 is also present underlying the source region and drain region portions of the fin structure 10. Therefore, the punch through stop 30 may be referred to as being between the active region of the fin structure 10 and the base semiconductor substrate 5. The base sidewall S1 is also present between the active region of the fin structure 10 and the base semiconductor substrate 5.

The conductivity type of the punch through stop region 30 is typically selected to have a conductivity type that is opposite the conductivity type of the device. The term "conductivity type" means that the dopant is either a p-type dopant or an n-type dopant. The opposite conductivity type of a p-type dopant is an n-type dopant, and the opposite conductivity type of an n-type dopant is a p-type dopant. For example, if the semiconductor device in an n-type Fin Field Effect Transistor (FinFET), the punch through stop region 30 may be doped to p-type conductivity. In another example, if the semiconductor device in a p-type Fin Field Effect Transistor (FinFET), the punch through stop region 30 may be doped to an n-type conductivity. By having an opposite conductivity type as the conductivity type of the FinFET, the punch through stop (PST) region produces a repulsive field underlying the active portion of the FinFET that obstructs leakage of charge carriers out of the active portion of the fin structure 10.

The punch through stop region 30 may be doped to a p-type or n-type conductivity. As used herein, "p-type" refers to the addition of impurities to an intrinsic semiconductor that creates deficiencies of valence electrons. For example, in a type IV semiconductor material, such as silicon (Si), examples of n-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon including fin structure 10, examples of n-type dopants, i.e., impurities, include but are not limited to antimony, arsenic and phosphorous.

The dopant that dictates the conductivity type of the punch through stop region 30 may be introduced to the portion of the fin structure 10 underlying the active region of the fin structure though the exposed sidewall S1 of the lower portion of the fin structure 10 that is present between the active portion of the fin structure 10 and the base semiconductor substrate 5. The dopant that dictates the conductivity type of the punch through stop region 30 may be implanted into the fin structure 10 using gas phase doping, i.e., plasma gas phase doping. Examples of dopant gasses used for implanting the punch through stop region 30 include arsine, diborane, phosphine, borine tri-fluoride, boron II trifluoride, tribromide, and combinations thereof.

Following doping of the base portion of the fin structure 10, an anneal process may activate the dopants. For example, the dopants in the punch through stop region 30 may be activated by an anneal process, such as laser annealing. The laser annealing may heat the punch through stop region 30 to a temperature ranging from 750° C. to 1250° C. In other embodiments, the laser annealing may heat the punch through stop region 30 to a temperature ranging from 900° C. to 1100° C. The anneal process for activating the dopants may include rapid thermal annealing, or furnace annealing. The dopant concentration of the first conductivity type dopant in the punch through stop region 30 may range from $1 \times 10^{18}$ dopants/cm$^3$ to $5 \times 10^{18}$ dopants/cm$^3$.

Figure 5:
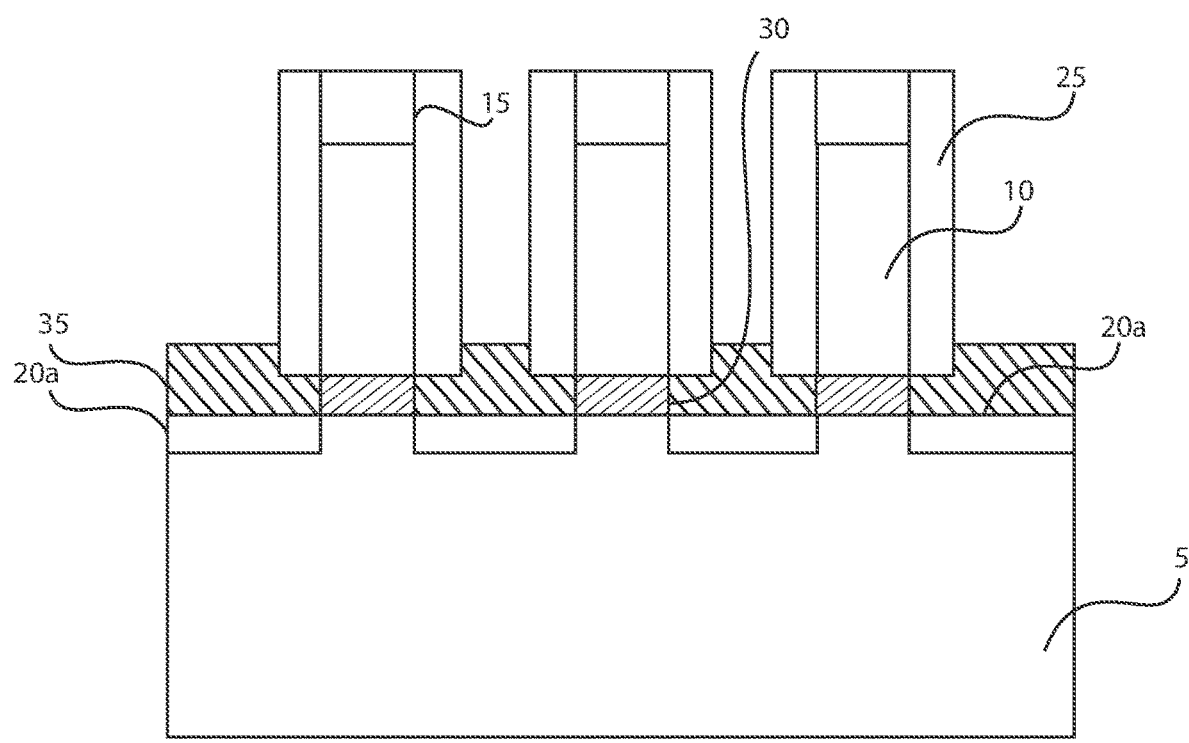
FIG. 5 is a side cross-sectional view depicting depositing the first dielectric material atop the recessed isolation regions to restore the height of the isolation regions between the adjacent fin structures, in accordance with one embodiment of the present disclosure.

FIG. 5 depicts one embodiment of depositing dielectric material 35 atop the recessed isolation regions 20a to restore the height of the isolation regions 20 between the adjacent fin structures 10. The dielectric material 35 being deposited at this stage of the present disclosure may be the same type as the recessed isolation regions 20a, e.g., may also be composed of a first dielectric material. For example, the dielectric material 35 may be an oxide, such as silicon oxide. The dielectric material 35 may be deposited using chemical vapor deposition (CVD). Examples of chemical vapor deposition that are suitable for depositing the dielectric material 35 may include plasma enhanced chemical vapor deposition (PECVD) or metal organic chemical vapor deposition (MOCVD). In one embodiment, the height of the deposited dielectric material may be deposited until the sidewalls of the punch through stop region 30 are covered by the dielectric material 35.

Figure 6:
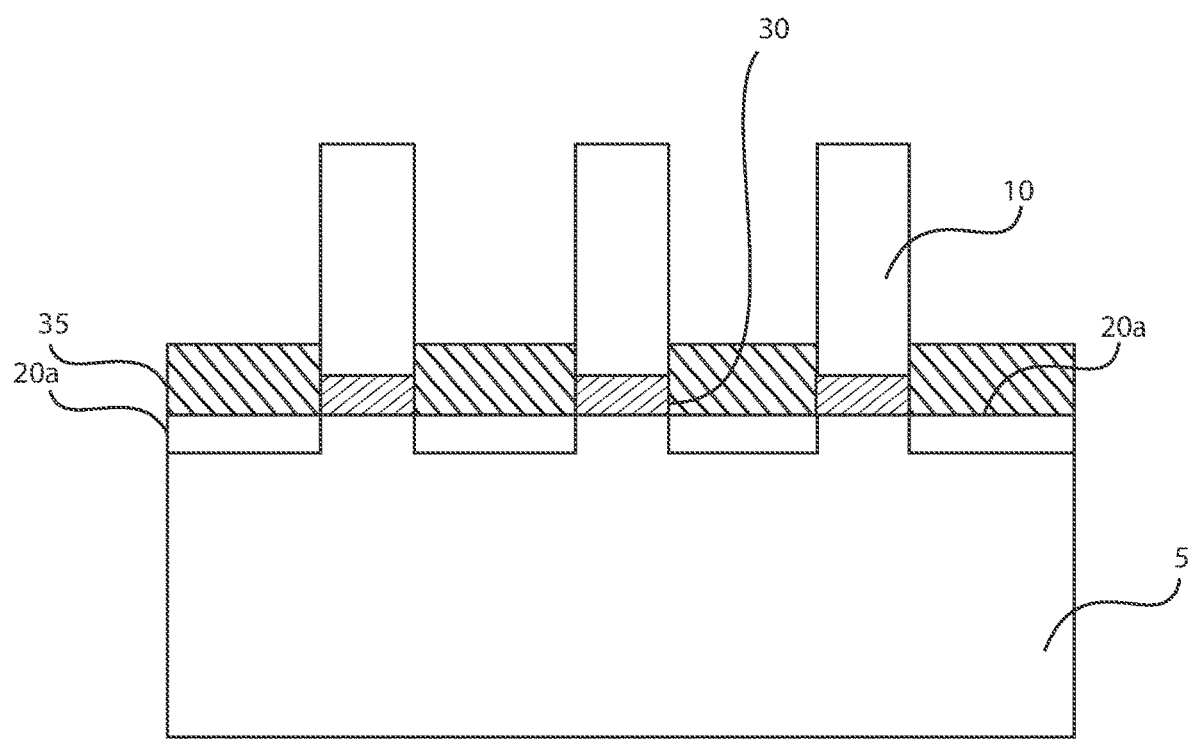
FIG. 6 is a side cross-sectional view depicting removing the spacer of the second dielectric material, in accordance with one embodiment of the present disclosure.

FIG. 6 depicts removing the spacer 25 of the second dielectric material to expose the sidewalls of the active region portion of the fin structure 10. The spacer 25 may be removed by a selective etch process that removes the second dielectric material of the spacer 25 selectively to the first dielectric material of the dielectric material 35 deposited atop the isolation regions 20a, and the semiconductor material of the fin structure 10. In some embodiments, the etch process for removing the spacer 25 also removes the hard mask 15.

Figure 7:
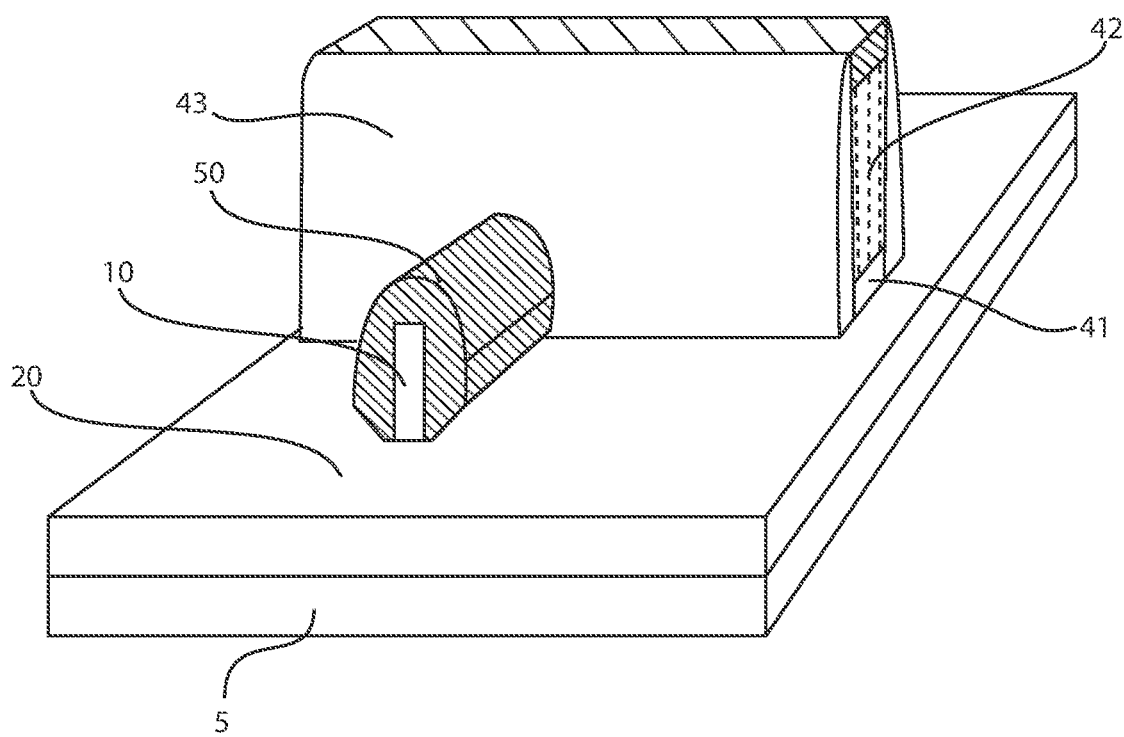
FIG. 7 is a perspective view depicting forming a gate structure and source and drain regions on the fin structures depicted in FIG. 6.

FIG. 7 depicts forming a gate structure 40 and source and drain region on one example of a fin structure 10 as depicted in FIG. 6. In FIG. 7 only one fin structure 10 is depicted for the sake of simplicity. Due to the perspective view, FIG. 7 only depicts one of the source and drain region, wherein the opposing of the source and drain region is on the opposite side of the gate structure 40.

FIG. 7 depicts forming a gate structure 40 on the channel region portion of the active region of the fin structure 10. The gate structure 40 typically includes at least a gate dielectric 41 that is present on the channel region of active portion the fin structure 10, and a gate electrode 42 that is present on the gate dielectric 41. In one embodiment, the at least one gate dielectric layer 41 includes, but is not limited to, an oxide, nitride, oxynitride and/or silicates including metal silicates, aluminates, titanates and nitrides. In one example, when the at least one gate dielectric layer 41 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 41 may vary, but typically, the at least one gate dielectric layer 41 has a thickness from 1 nm to 10 nm. In another embodiment, the at least one gate dielectric layer 41 has a thickness from 1 nm to 3 nm.

The conductive material of the gate electrode 42 may comprise polysilicon, SiGe, a silicide, a metal or a metal-silicon-nitride such as Ta—Si—N. Examples of metals that can be used as the gate electrode 42 include, but are not limited to, Al, W, Cu, and Ti or other like conductive metals. The layer of conductive material for the gate electrode 42 may be doped or undoped. If doped, an in-situ doping deposition process may be employed. Alternatively, a doped conductive material can be formed by deposition, ion implantation and annealing. In yet another embodiment, when the fin structure 10 is being employed in a p-FinFET, the gate electrode may be composed of a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

In yet another embodiment, when the fin structure 10 is being employed in an n-FinFET, the gate electrode 42 may include an n-type work function metal layer. An "n-type work function metal layer" is a metal layer that effectuates an n-type threshold voltage shift. In one embodiment, the work function of the n-type work function metal layer ranges from 4.1 eV to 4.3 eV. In some embodiments, the n-type work function metal layer is composed of at least one of TiAl, Tan N, TiN, HfN, HfSi, or combinations thereof.

The gate structure 40 may be formed by using a deposition method, such as a chemical vapor deposition method and/or a physical vapor deposition (PVD), to deposit the material layers for the at least one gate dielectric layer 41 and the at least one gate electrode 42 followed by photolithography and etch processing.

In some embodiments, a gate sidewall spacer 43 can be formed on the sidewall of the gate structure 40, as depicted in FIG. 7. In one embodiment, the gate sidewall spacer 43 may be formed by using a blanket layer deposition process, such as CVD, and an anisotropic etchback method. The gate sidewall spacer 43 may have a width ranging from 2.0 nm to 15.0 nm, and may be composed of a dielectric, such as a nitride, oxide, oxynitride, or a combination thereof.

FIG. 6 depicts one embodiment of forming source and drain regions on the source and drain region portions of the fin structure 10 that are present on opposing sides of the fin structure's channel region. In some examples, the conductivity type of the source and drain regions indicates the conductivity type of the device. For example, a p-type FinFET would have p-type source and drain regions, and an n-type FinFET would have n-type source and drain regions.

The source and drain regions typically include an epitaxial semiconductor material 50 that is formed on the source and drain region portions of the active portion of the fin structure 10. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus.

The epitaxial semiconductor material 50 for the source and drain regions may be a type IV semiconductor, such as silicon (Si), silicon germanium (SiGe), germanium (Ge), silicon doped with carbon (Si:C), or the epitaxial semiconductor material 50 for the source and drain regions may be at type III-V compound semiconductor material, such as gallium arsenide (GaAs). The epitaxial semiconductor material 50 may be doped to the conductivity type of the source and drain region. For example, if the semiconductor device is an n-type FinFET, the epitaxial semiconductor material 50 that is present on the source and drain region portions of the fin structure 10 is doped to an n-type conductivity; and if the semiconductor device is a p-type FinFET, the epitaxial semiconductor material 50 that is present on the source and drain region portions of the fin structure 10 is doped to a p-type conductivity. The n-type or p-type dopant in the source and drain regions may also be referred to a charge carrier type dopant.

The dopant may be introduced to the epitaxial semiconductor material 50 using in-situ doping. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material. In some embodiments, extension source and drain regions may be formed in the source and drain region portions of the active portion of the fin structure 10 by thermally diffusing the dopant from the epitaxial semiconductor material 50 into the active portion of the fin structures 10. In some embodiments, the charge carrier type dopant in said source and drain region is present in a concentration ranging from $1 \times 10^{20}$ dopants/cm$^3$ to $1 \times 10^{21}$ dopants/cm$^3$.

It is noted that in the above examples, a gate first process has been described for forming the gate structure 40. The methods and structures of the present disclosure are not limited to only this process flow, as gate last processing is also suitable for use with the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

In another aspect of the present disclosure, a semiconductor device is provided that includes a punch through stop region 30 of a first conductivity type dopant that is present in a base portion of a fin structure 10 that is underlying a channel portion of the semiconductor device. Source and drain regions 50 of a second conductivity type is present on the source and drain region portions of the fin structure. The channel portion of the semiconductor device is substantially free of the first conductivity type dopant that provides the punch through stop region 30. The punch through dopant in the punch through stop (PTS) region 30 of the isolating portion of the fin structure 10 may be present in a concentration ranging from $1 \times 10^{18}$ dopants/cm$^3$ to $5 \times 10^{18}$ dopants/cm$^3$. The channel region portion of the active portion of the fin structure 10 typically has a substantially lower concentration of punch through dopant. For example, the concentration of punch through stopper dopant that diffuses into the active portion of the fin structure 10 using the methods described with reference to FIGS. 1-5 is orders of magnitude less than the concentration of the punch through stopper dopant that is present in the channel region of device formed using prior methods, such as ion implantation. The punch through stop region 30 is also present in a portion of the fin structure 10 that is below an upper surface of the isolation regions 30a, 35 that are separating adjacent fin structures 10.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a punch through stop region of a first conductivity type dopant that is present in a base portion of a fin structure that is underlying a channel portion of the fin structure;
   source and drain regions of a second conductivity type that are present on the source and drain region portions of the fin structure, the channel portion of the fin structure being substantially free of the first conductivity type dopant that provides the punch through stop region; and
   a dielectric material directly contacting sidewalls of the punch through stop region,
   wherein a bottom surface of the punch through stop region is coplanar with a top surface of dielectric isolation regions.

2. The semiconductor device of claim 1, wherein a charge carrier type dopant in the source and drain region is present in a concentration ranging from $1 \times 10^{20}$ dopants/cm$^3$ to $2 \times 10^{20}$ dopants/cm$^3$.

3. The semiconductor device of claim 1, wherein punch through dopant in the doped punch through stop region is present in a concentration ranging from $4 \times 10^{18}$ dopants/cm$^3$ to $3 \times 10^{19}$ dopants/cm$^3$.

4. The semiconductor device of claim 3, wherein a concentration of the punch through dopant in the channel is less than $1 \times 10^{17}$ dopants/cm$^3$.

5. The semiconductor device of claim 1, wherein a spacer is disposed on sidewalls of the fin structure.

6. The semiconductor device of claim 5, wherein the spacer includes nitride.

7. The semiconductor device of claim 6, wherein the dielectric isolation regions are disposed adjacent to the base portion of the fin structure.

8. The semiconductor device of claim 5, wherein the dielectric material is in direct contact with bottom sidewalls of the spacer.

9. The semiconductor device of claim 5, wherein the spacer is removed after depositing the dielectric material.

10. The semiconductor device of claim 1, wherein the dielectric material extends above a top surface of the punch through stop region.

11. A semiconductor device comprising:
a spacer disposed on sidewalls of fin structures;
dielectric isolation regions disposed adjacent to base portions of the fin structures, wherein a portion of the fin structures underlying the spacer is exposed;
a dopant used to dope the exposed portion of the fin structures underlying the spacer, the dopant having a first conductivity type to form a punch through stop region; and
a dielectric material disposed in direct contact with bottom sidewalls of the spacer,
wherein a bottom surface of the punch through stop region is coplanar with a top surface of the dielectric isolation regions.

12. The semiconductor device of claim 11, wherein the dielectric material is disposed in direct contact with the punch through stop region.

13. The semiconductor device of claim 12, wherein the spacer is removed after depositing the dielectric material.

14. The semiconductor device of claim 13, wherein source and drain regions are disposed on source and drain region portions of the fin structures.

15. The semiconductor device of claim 14, wherein the source and drain regions are doped with a second conductivity type dopant.

16. The semiconductor device of claim 15, wherein the spacer includes nitride.

17. The semiconductor device of claim 16, wherein a charge carrier type dopant in the source and drain regions is present in a concentration ranging from $1 \times 10^{20}$ dopants/cm$^3$ to $2 \times 10^{20}$ dopants/cm$^3$.

18. The semiconductor device of claim 17, wherein punch through dopant in the doped punch through stop region is present in a concentration ranging from $4 \times 10^{18}$ dopants/cm$^3$ to $3 \times 10^{19}$ dopants/cm$^3$.

19. The semiconductor device of claim 18, wherein a concentration of the punch through dopant in the channel is less than $1 \times 10^{17}$ dopants/cm$^3$.

20. The semiconductor device of claim 11, wherein doping the exposed portion of the fin structures underlying the spacer includes gas phase doping.

* * * * *